US008847062B2

(12) United States Patent
Fukumochi et al.

(10) Patent No.: US 8,847,062 B2
(45) Date of Patent: Sep. 30, 2014

(54) SOLAR CELL MODULE

(71) Applicants: SANYO Electro Co., Ltd., Moriguchi (JP); Panasonic Corporation, Kadoma (JP)

(72) Inventors: Shuji Fukumochi, Kaizuka (JP); Toshiyuki Sakuma, Izumisano (JP); Shingo Okamoto, Toyonaka (JP); Kenichiro Mase, Osaka (JP)

(73) Assignee: SANYO Electric Co., Ltd., Moriguchi (JP)

( * ) Notice: Subject to any disclaimer, the term of this patent is extended or adjusted under 35 U.S.C. 154(b) by 0 days.

(21) Appl. No.: 13/888,437

(22) Filed: May 7, 2013

(65) Prior Publication Data

US 2013/0298966 A1    Nov. 14, 2013

(30) Foreign Application Priority Data

May 9, 2012    (JP) ................................. 2012-107227

(51) Int. Cl.
*H01L 31/052*    (2014.01)
(52) U.S. Cl.
CPC ........ *H01L 31/0527* (2013.01); *H01L 31/0525* (2013.01); *Y02E 10/52* (2013.01)
USPC .......................................... 136/246; 136/251
(58) Field of Classification Search
USPC ................................................. 136/246, 251
See application file for complete search history.

(56) References Cited

U.S. PATENT DOCUMENTS

| | | | | |
|---|---|---|---|---|
| 6,818,819 | B2 * | 11/2004 | Morizane et al. | 136/251 |
| 8,063,299 | B2 * | 11/2011 | Haga | 136/246 |
| 2001/0011552 | A1 * | 8/2001 | Morizane et al. | 136/251 |
| 2001/0020486 | A1 * | 9/2001 | Tsuge | 136/251 |
| 2001/0037825 | A1 * | 11/2001 | Nakano et al. | 136/256 |
| 2003/0178056 | A1 * | 9/2003 | Hikosaka et al. | 136/251 |
| 2006/0107991 | A1 * | 5/2006 | Baba | 136/244 |
| 2009/0301560 | A1 * | 12/2009 | Nakai | 136/256 |
| 2011/0277817 | A1 * | 11/2011 | Ide et al. | 136/246 |

FOREIGN PATENT DOCUMENTS

JP    2012-033591 A    2/2012

* cited by examiner

*Primary Examiner* — Golam Mowla
(74) *Attorney, Agent, or Firm* — Marvin A. Motsenbocker; Mots Law, PLLC

(57) ABSTRACT

A solar cell module is provided with a plurality of solar cells each having a rectangular shape with chamfered corners, a protection member arranged in a light receiving surface side of the solar cells, and a reflection member having a rectangular shape in a plan view. The reflection member is arranged in an area surrounded by the solar cells. The reflection member includes a reflection surface. The reflection surface includes a plurality of areas. The areas are provided so that reflection directions of light perpendicular to the light receiving surfaces are different from each other in adjacent ones of the areas, the adjacent ones being adjacent to each other in a row direction or a column direction of the solar cells.

8 Claims, 7 Drawing Sheets

SOLAR CELL MODULE

BACKGROUND OF THE INVENTION

1. Field of the Invention

The present invention relates to a solar cell module.

2. Description of Related Art

There is known a solar cell module that has a plurality of solar cells arranged in a matrix so as to be spaced from each other (Japanese Unexamined Patent Application Publication No. 2012-33591 and the like, for example).

SUMMARY OF THE INVENTION

There is a desire to improve the output characteristics of a solar cell module.

It is a main object of the present invention to provide a solar cell module having improved photoelectric conversion efficiency.

A solar cell module according to the present invention is provided with a plurality of solar cells each having a rectangular shape with chamfered corners, a protection member arranged in a light receiving surface side of the solar cells, and a reflection member having a rectangular shape in a plan view. The solar cells are arranged in a matrix so as to be spaced from each other. The protection member is arranged in the light receiving surface side of the solar cells. The reflection member is arranged in an area surrounded by the solar cells. The reflection member includes a reflection surface. The reflection surface reflects incident light from a light receiving surface side toward the protection member. The reflection surface includes a plurality of areas. The areas are provided so that reflection directions of light perpendicular to the light receiving surfaces are different from each other in adjacent ones of the areas, the adjacent ones being adjacent to each other in a row direction or a column direction of the solar cells.

The present invention makes it possible to provide a solar cell module having improved photoelectric conversion efficiency.

DETAILED DESCRIPTION OF THE PREFERRED EXAMPLES

Hereinafter, an example of a preferred embodiment of the present invention will be described. However, the following embodiment is merely illustrative. Therefore, the present invention is not limited to the following embodiment.

Further, members having substantially the same function as each other are denoted by the same reference sign throughout the drawings referenced in the embodiment and the like. Further, the drawings referenced in the embodiment and the like are schematically described. Therefore, a ratio between the sizes of objects illustrated in each of the drawings may be different from that of actual objects. Further, ratios between the sizes of objects and the like may differ between the drawings. A specific ratio between the sizes of objects should be determined by taking the following description into consideration.

Figure 1:
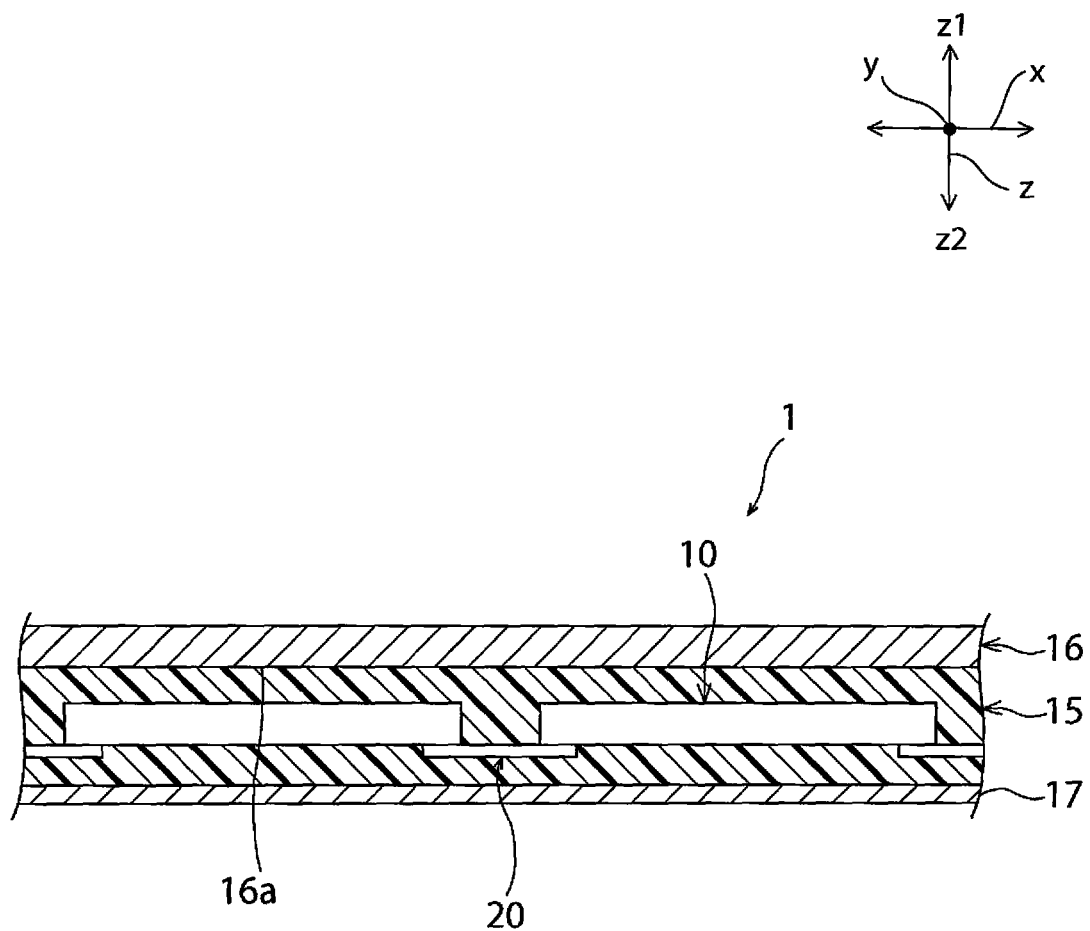
FIG. 1 is a schematic cross-sectional view of a solar cell module according to an embodiment of the present invention.
Figure 2:
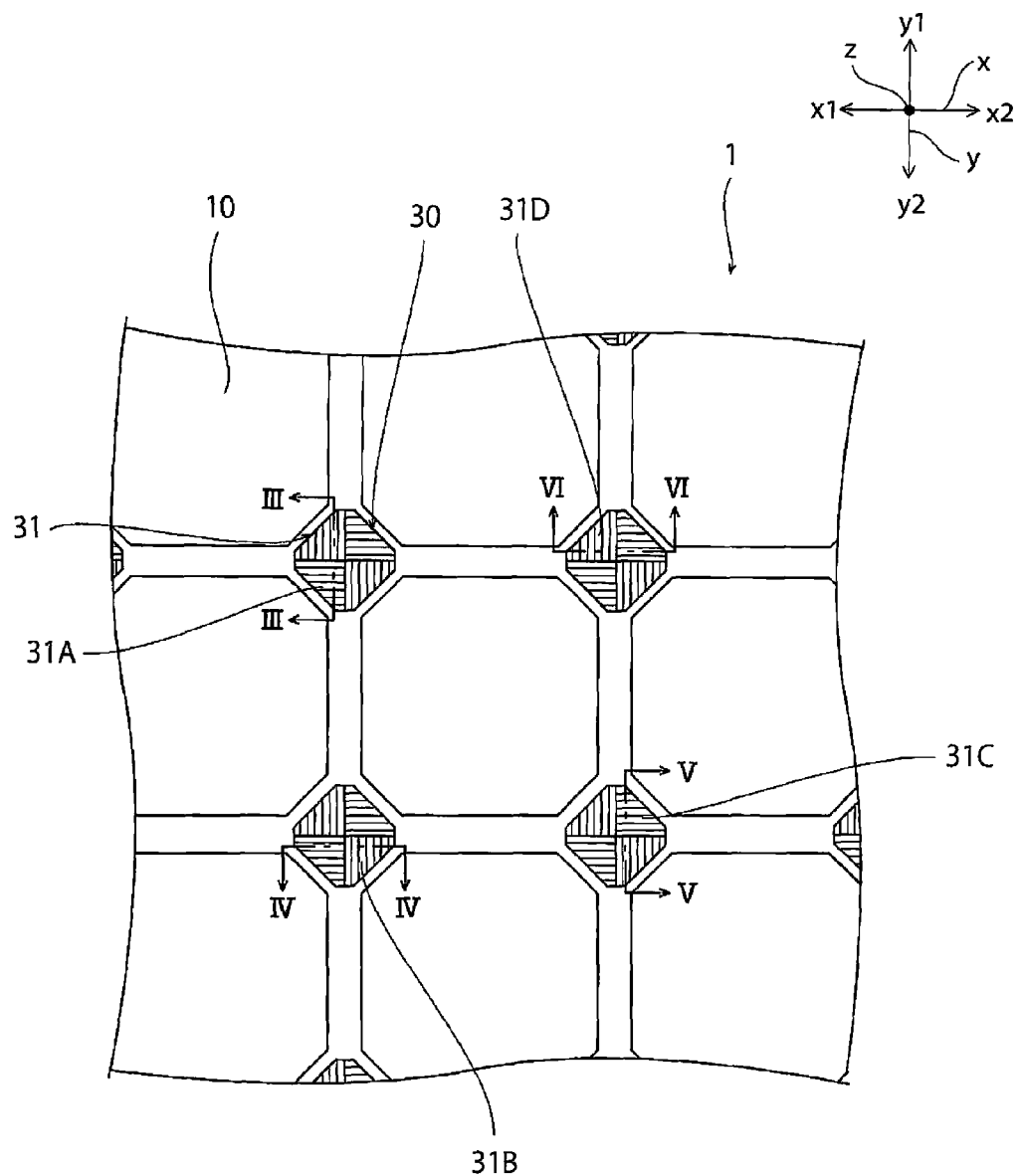
FIG. 2 is a schematic plan view illustrating solar cells and reflection members in the embodiment of the present invention.

As shown in FIG. 1 and FIG. 2, a solar cell module 1 is provided with a plurality of solar cells 10 which are electrically connected to each other by wiring materials 20. The solar cells 10 are arranged in a matrix so as to be spaced from each other in an x-axis direction (a row direction) and a y-axis direction (a column direction) which is perpendicular to the x-axis direction.

Each of the solar cells 10 is formed into a rectangular shape with chamfered corners, namely, a generally octagonal shape. Therefore, as shown in FIG. 2, there are rectangular areas in which no solar cell 10 is provided between corners of respective adjacent four of the solar cells 10. Specifically, each of the solar cells 10 is formed into a square shape with chamfered corners. There are square areas in which no solar cell 10 is provided between corners of respective adjacent four of the solar cells 10.

The type of the solar cells 10 is not particularly limited. The solar cells 10 may be crystalline silicon solar cells or thin silicon solar cells, for example.

As shown in FIG. 1, a first protection member 16 is arranged so as to face light receiving surfaces of the solar cells 10 (at a z1 side). The first protection member 16 can be composed of, for example, a glass plate or a ceramic plate.

A second protection member 17 is arranged so as to face back surfaces of the solar cells 10 (at a z2 side). The second protection member 17 can be composed of, for example, a resin sheet or a resin sheet having a barrier layer such as a metal layer.

A filler layer 15 is provided between the first protection member 16 and the second protection member 17. The solar cells 10 are sealed by the filler layer 15. The filler layer 15 can be composed of, for example, a crosslinked resin such as ethylene-vinyl acetate copolymer (EVA) or a non-crosslinked resin such as polyolefin.

As shown in FIG. 2, reflection members 30 are arranged in respective areas surrounded by corners of respective adjacent four of the solar cells 10. Each of the reflection members 30 has a shape corresponding to the shape of an area surrounded by corners of respective adjacent four of the solar cells 10. Specifically, the shape of each of the reflection members 30 in a plan view is a rectangular shape. More specifically, the shape of each of the reflection members 30 in a plan view is a rectangular shape with corners which are chamfered with straight lines or rounded off. The reflection members 30 are arranged so as to be spaced from the solar cells 10. Accordingly, each of the reflection members 30 can be composed of, for example, an electrically-conductive material such as silver having high optical reflectance.

Each of the reflection members 30 includes a reflection surface 31. The reflection surface 31 is provided throughout the entire surface of each of the reflection members 30. Therefore, the shape of the reflection surface 31 in a plan view is also a rectangular shape. The reflection surface 31 reflects incident light from a light receiving surface side (the z1 side)

toward the first protection member 16. The reflection surface 31 is configured so that normal incident light from the light receiving surface side (the z1 side) (light that vertically enters a surface of the first protection member 16) is reflected by the reflection surface 31, and then totally reflected by a surface 16a of the first protection member 16, the surface 16a facing the solar cells 10.

The reflection surface 31 includes first to fourth areas 31A to 31D which are divided by two intersecting virtual lines. Specifically, the reflection surface 31 is divided into the first to fourth areas 31A to 31D by the two intersecting virtual lines, namely, a virtual line parallel to the row direction and a virtual line parallel to the column direction. More specifically, the two virtual lines constitute diagonal lines of the reflection surface 31.

The first to fourth areas 31A to 31D include a plurality of convex portions 31a to 31d, respectively. A cross section of each of the convex portions 31a to 31d has a generally triangular shape, specifically, a generally isosceles triangular shape. The convex portions 31a which are parallel to each other are provided in the first area 31A. In the same manner, the convex portions 31b which are parallel to each other are provided in the second area 31B. The convex portions 31c which are parallel to each other are provided in the third area 31C. The convex portions 31d which are parallel to each other are provided in the fourth area 31D.

The first to fourth areas 31A to 31D are provided so that reflection directions of light perpendicular to the reflection surface 31 (light in a z-axis direction) (hereinafter, just referred to as "reflection directions") are different from each other in adjacent areas among the first to fourth areas 31A to 31D, the adjacent areas being adjacent to each other in the row and the column direction of the solar cells 10. That is, the first to fourth areas 31A to 31D are provided so that directions perpendicular to surfaces of the respective first to fourth areas 31A to 31D are different from each other in adjacent areas among the first to fourth areas 31A to 31D, the adjacent areas being adjacent to each other in the row and column directions of the solar cells 10.

Specifically, the first to fourth areas 31A to 31D are provided so that the reflection directions are perpendicular to each other in adjacent areas among the first to fourth areas 31A to 31D, the adjacent areas being adjacent to each other in the row and column directions of the solar cells 10. More specifically, the reflection direction in the first area 31A is perpendicular to that in the second area 31B and the fourth area 31D which are adjacent to the first area 31A. The reflection direction in the third area 31C is perpendicular to that in the second area 31B and the fourth area 31D which are adjacent to the third area 31C. The reflection direction in the first area 31A is the same as that in the third area 31C. The first to fourth areas 31A to 31D are provided so that, in a plan view (when viewing an x-y plane from the z-axis direction), a normal direction in each of the first to fourth areas 31A to 31D is parallel to either of the two intersecting lines which divide the first to fourth areas 31A to 31D.

Figure 3:
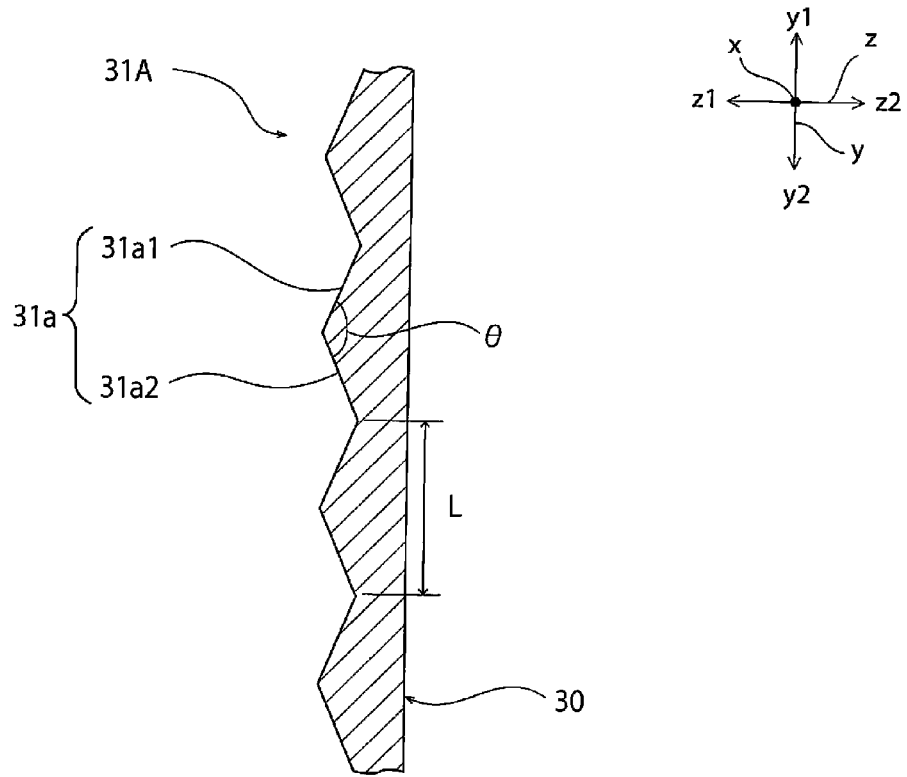
FIG. 3 is a schematic cross-sectional view taken along line III-III of FIG. 2.

For more detail, as shown in FIG. 3, the first area 31A includes the linear convex portions 31a each of which extends in the x-axis direction in a plan view and has a first reflection surface 31a1 and a second reflection surface 31a2. The first reflection surface 31a1 and the second reflection surface 31a2 are adjacent to each other in the y-axis direction. The first reflection surface 31a1 and the second reflection surface 31a2 constitute each of the liner convex portions 31a extending in the x-axis direction and having a triangular cross-sectional shape (typically, an isosceles triangular cross-sectional shape). An angle θ between the first reflection surface 31a1 and the second reflection surface 31a2 is preferably equal to or less than 138.5°, and more preferably within the range of 112° to 138.5°.

Figure 4:
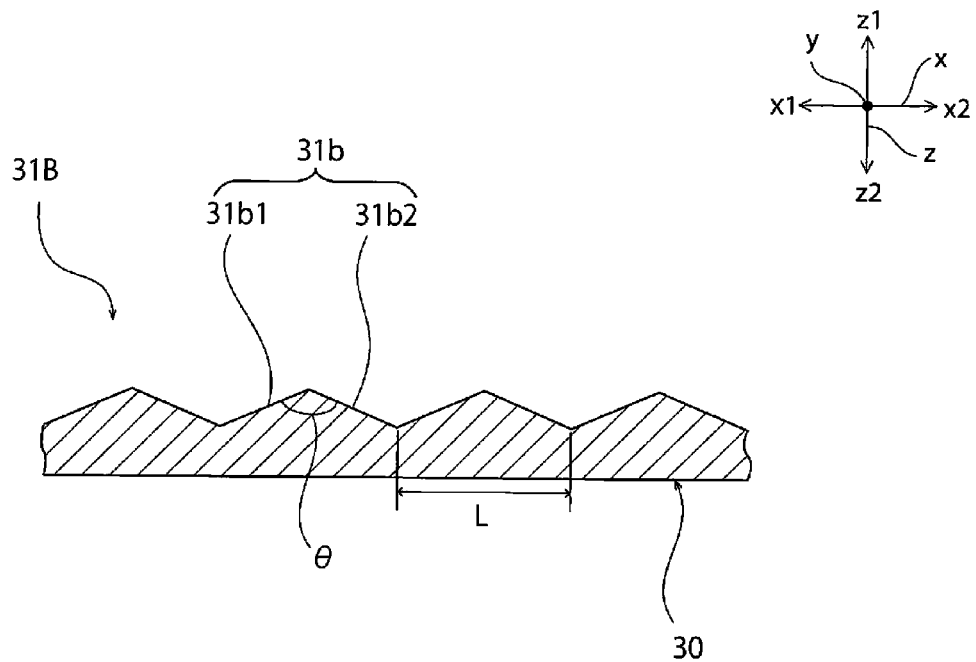
FIG. 4 is a schematic cross-sectional view taken along line IV-IV of FIG. 2.

As shown in FIG. 4, the second area 31B includes the linear convex portions 31b each of which extends in the x-axis direction in a plan view and has a first reflection surface 31b1 and a second reflection surface 31b2. The first reflection surface 31b1 and the second reflection surface 31b2 are adjacent to each other in the x-axis direction. The first reflection surface 31b1 and the second reflection surface 31b2 constitute each of the liner convex portions 31b extending in the y-axis direction and having a triangular cross-sectional shape (typically, an isosceles triangular cross-sectional shape). An angle θ between the first reflection surface 31b1 and the second reflection surface 31b2 is preferably equal to or less than 138.5°, and more preferably within the range of 112° to 138.5°.

Figure 5:
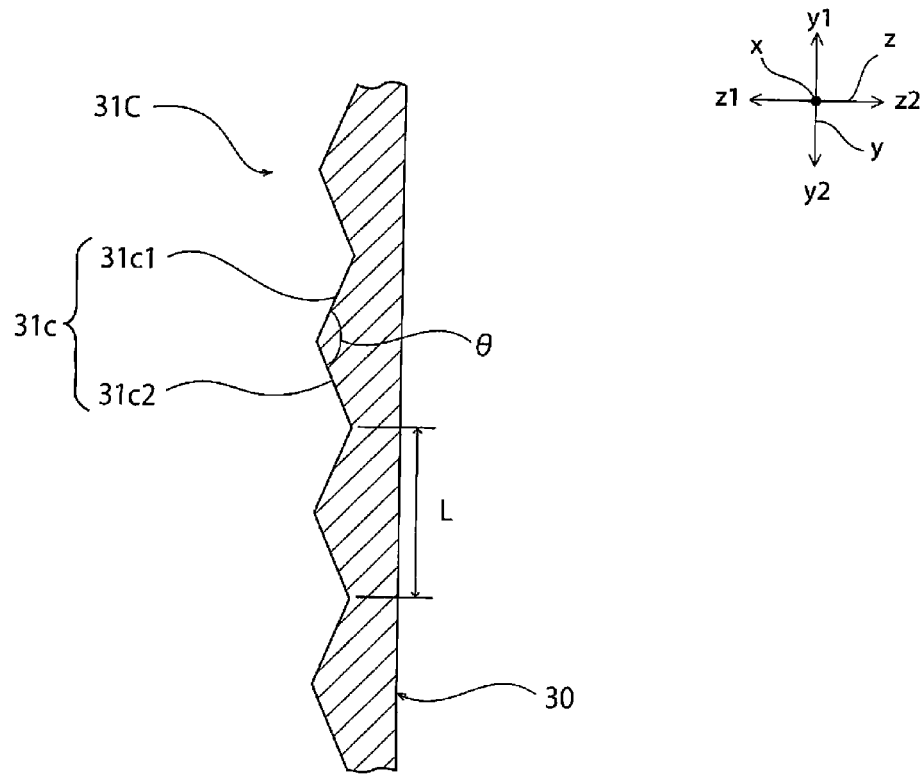
FIG. 5 is a schematic cross-sectional view taken along line V-V of FIG. 2.

As shown in FIG. 5, the third area 31C includes the linear convex portions 31c each of which extends in the x-axis direction in a plan view and has a first reflection surface 31c1 and a second reflection surface 31c2. The first reflection surface 31c1 and the second reflection surface 31c2 are adjacent to each other in the y-axis direction. The first reflection surface 31c1 and the second reflection surface 31c2 constitute each of the liner convex portions 31c extending in the x-axis direction and having a triangular cross-sectional shape (typically, an isosceles triangular cross-sectional shape). An angle θ between the first reflection surface 31c1 and the second reflection surface 31c2 is preferably equal to or less than 138.5°, and more preferably within the range of 112° to 138.5°.

Figure 6:
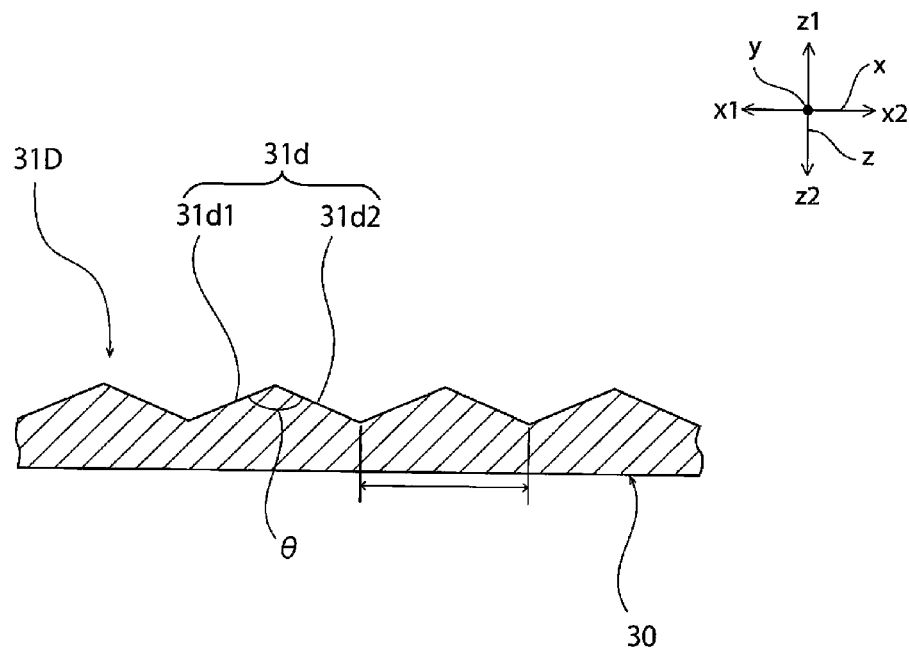
FIG. 6 is a schematic cross-sectional view taken along line VI-VI of FIG. 2.

As shown in FIG. 6, the fourth area 31D includes the linear convex portions 31d each of which extends in the x-axis direction in a plan view and has a first reflection surface 31d1 and a second reflection surface 31d2. The first reflection surface 31d1 and the second reflection surface 31d2 are adjacent to each other in the x-axis direction. The first reflection surface 31d1 and the second reflection surface 31d2 constitute each of the liner convex portions 31d extending in the y-axis direction and having a triangular cross-sectional shape (typically, an isosceles triangular cross-sectional shape). An angle θ between the first reflection surface 31d1 and the second reflection surface 31d2 is preferably equal to or less than 138.5°, and more preferably within the range of 112° to 138.5°.

Directions in which the respective convex portions 31a to 31d extend are different from each other in adjacent areas among the first to fourth areas 31A to 31D, the adjacent areas being adjacent to each other in the row direction or the column direction of the solar cells 10.

Figure 7:
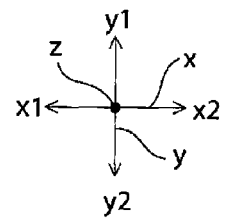
FIG. 7 is a schematic plan view of a solar cell module according to a reference example.
Figure 7:
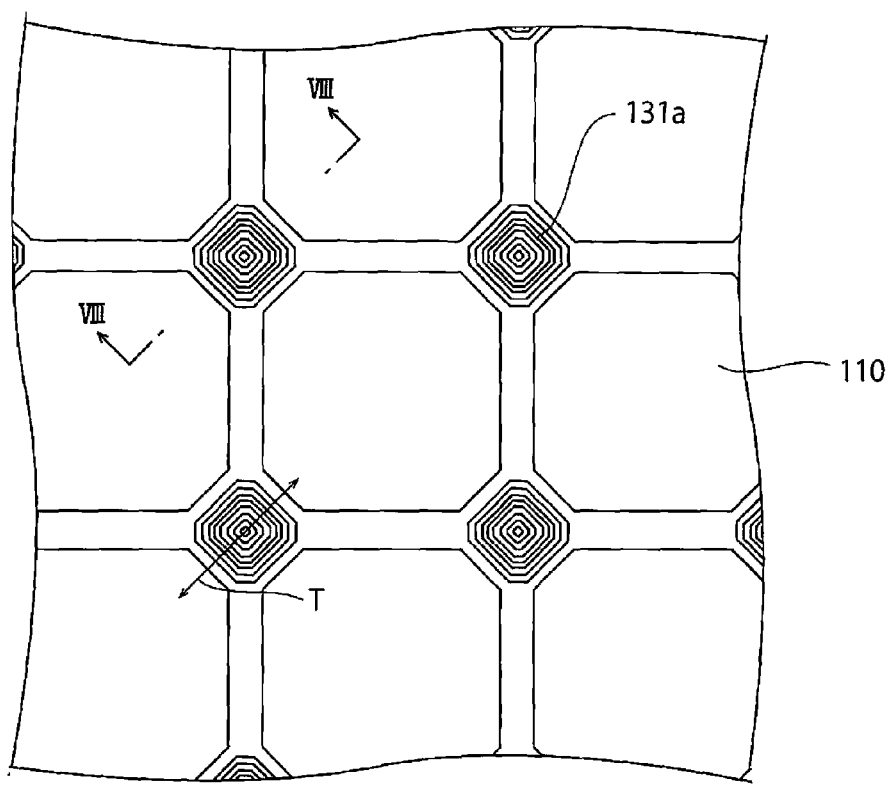
Figure 8:
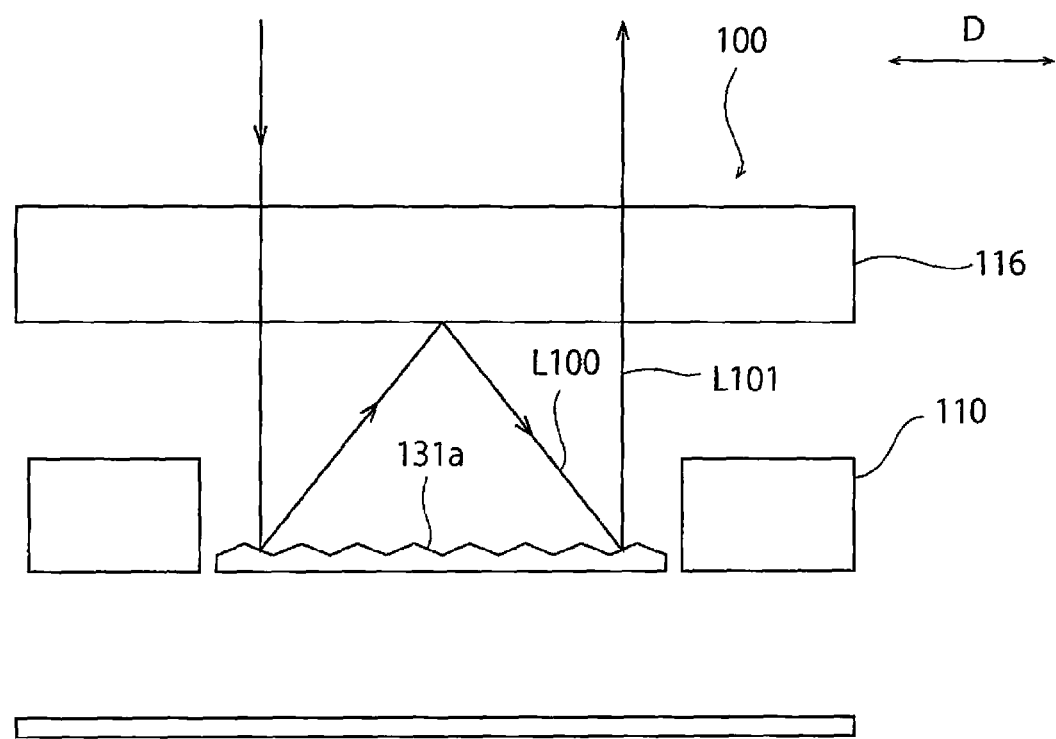
FIG. 8 is a schematic cross-sectional view of the solar cell module according to the reference example.

As shown in FIG. 7, a reflection surface 131a could be annularly arranged around an axis extending in the z-axis direction as a central axis. However, in this case, the same pattern is continued over a long distance in a direction extending outward from a central axis of the reflection member 30, for example, in a direction T in which diagonal lines of solar cells 110 extend. Therefore, as shown in FIG. 8, light L100 which is produced in such a manner that incident light from the light receiving surface side is reflected by the reflection surface 131a and then reflected again by a surface of a first protection member 116, the surface facing the solar cells 110, toward the solar cells 110 is reflected again by the reflection surface 131a, and may thereby become light L101 which is perpendicular to the first protection member 116. In this case, the light L101 which is perpendicular to the first protection member 116 penetrates the protection member 116 and then exits to the outside of a solar cell module 100. As a result, the usage efficiency of light is reduced.

Figure 9:
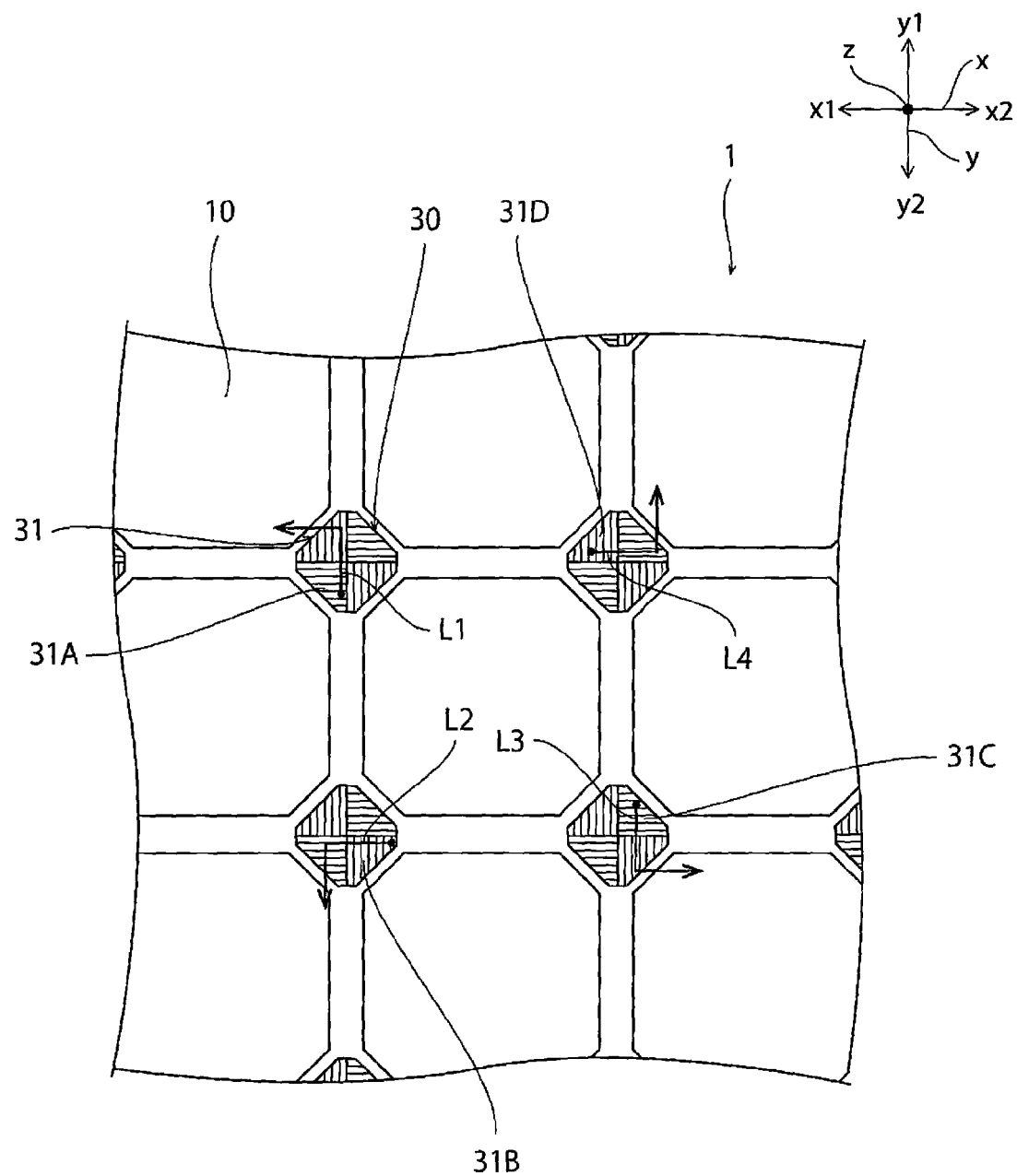
FIG. 9 is a schematic plan view of the solar cell module according to the embodiment of the present invention.

On the other hand, in the solar cell module 1, the first to fourth areas 31A to 31D are provided so that reflection directions of light perpendicular to the light receiving surfaces (light in the z-axis direction) are different from each other in adjacent areas among the first to fourth areas 31A to 31D, the adjacent areas being adjacent to each other in the row and column directions of the solar cells 10. Therefore, the same pattern is continued only on a short distance in an x-y direction of the reflection surface 31. More specifically, light perpendicular to the first protection member 16, the light being produced in such a manner that light which has been reflected by one area is reflected by the surface 16a of the first protection member 16, the surface 16a facing the solar cells 10, and then reflected again by the same area, can be made less likely to be produced. Specifically, as shown in FIG. 9, since light L1 which has been reflected by the first reflection surface 31a1 of the first area 31A is reflected by the surface 16a, and then enters the fourth area 31D, the light L1 is inclined toward x1 as viewed facing z1. Accordingly, the light L1 is reflected again by the first protection member 16, and then likely to enter one of the solar cells 10. Since light L2 which has been reflected by the first reflection surface 31b1 of the second area 31B is reflected by the surface 16a, and then enters the first area 31A, the light L2 is inclined toward y2 as viewed facing z1. Accordingly, the light L2 is reflected again by the first protection member 16, and then likely to enter one of the solar cells 10. Since light L3 which has been reflected by the second reflection surface 31c2 of the third area 31C is reflected by the surface 16a, and then enters the second area 31B, the light L3 is inclined toward x2 as viewed facing z1. Accordingly, the light L3 is reflected again by the first protection member 16, and then likely to enter one of the solar cells 10. Since light L4 which has been reflected by the second reflection surface 31d2 of the fourth area 31D is reflected by the surface 16a, and then enters the third area 31C, the light L4 is inclined toward y1 as viewed facing z1. Accordingly, the light L4 is reflected again by the first protection member 16, and then likely to enter one of the solar cells 10. As a result, the solar cell module 1 having improved photoelectric conversion efficiency can be achieved.

What is claimed is:

1. A solar cell module comprising:
   a plurality of solar cells each having a rectangular shape with chamfered corners, the solar cells being arranged in a matrix so as to be spaced from each other;
   a protection member arranged in a light receiving surface side of the solar cells; and
   a reflection member having a rectangular shape in a plan view, the reflection member being arranged in an area surrounded by the solar cells and including a reflection surface for reflecting incident light from the light receiving surface side toward the protection member,
   wherein the reflection surface includes a plurality of areas, and the areas are provided so that reflection directions of light perpendicular to the light receiving surfaces are different from each other in adjacent ones of the areas, the adjacent ones being adjacent to each other in a row direction or a column direction of the solar cells.

2. The solar cell module according to claim 1, wherein each of the areas includes a first reflection surface and a second reflection surface adjacent to the first reflection surface in which a reflection direction of light perpendicular to the light receiving surfaces is different from the reflection direction in the first reflection surface by 180° in a plane view.

3. The solar cell module according to claim 2, wherein an angle between the first reflection surface and the second reflection surface is equal to or less than 138.5°.

4. The solar cell module according to claim 2, wherein directions in which a convex portion composed of the first reflection surface and the second reflection surface extends are different from each other in adjacent ones of the areas, the adjacent ones being adjacent to each other in the row direction or the column direction of the solar cells.

5. The solar cell module according to claim 1, wherein the areas include first to fourth areas divided by two intersecting virtual lines.

6. The solar cell module according to claim 5, wherein the first to fourth areas are provided so that reflection directions of light perpendicular to the light receiving surfaces are perpendicular to each other in adjacent areas among the first to fourth areas, the adjacent areas being adjacent to each other across the virtual lines.

7. The solar cell module according to claim 5, wherein each of the first to fourth areas is provided so that a reflection direction of light perpendicular to the light receiving surfaces is parallel to either of the two virtual lines in a plan view.

8. The solar cell module according to claim 1, wherein the reflection surface is configured so that normal incident light from the light receiving surface side is reflected by the reflection surface and then totally reflected by a surface of the protection member, the surface facing the solar cells.

* * * * *

UNITED STATES PATENT AND TRADEMARK OFFICE
CERTIFICATE OF CORRECTION

PATENT NO. : 8,847,062 B2  
APPLICATION NO. : 13/888437  
DATED : September 30, 2014  
INVENTOR(S) : Shuji Fukumochi et al.

Page 1 of 1

It is certified that error appears in the above-identified patent and that said Letters Patent is hereby corrected as shown below:

On Title page, in column 1, for item 71 "Applicants", line 1-3, delete "SANYO Electro Co., Ltd., Moriguchi (JP); Panasonic Corporation, Kadoma (JP)" and insert --SANYO Electric Co., Ltd., Moriguchi City (JP); Panasonic Corporation, Kadoma-shi (JP)--, and On Title page, in column 1, for item 73 "Assignee", line 1-2, delete "SANYO Electric Co., Ltd., Moriguchi (JP)" and insert --SANYO Electric Co., Ltd., Moriguchi City (JP); Panasonic Corporation, Kadoma-shi (JP)--, therefor.

Signed and Sealed this  
Twenty-eighth Day of June, 2016

Michelle K. Lee  
*Director of the United States Patent and Trademark Office*